(12) United States Patent
Paek et al.

(10) Patent No.: US 9,502,375 B2
(45) Date of Patent: Nov. 22, 2016

(54) SEMICONDUCTOR DEVICE WITH PLATED PILLARS AND LEADS

(71) Applicant: Amkor Technology, Inc., Chandler, AZ (US)

(72) Inventors: Jong Sik Paek, Incheon (KR); Doo Hyun Park, Gyeonggi-do (KR); Seong Min Seo, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/063,853

(22) Filed: Oct. 25, 2013

(65) Prior Publication Data

US 2015/0021751 A1    Jan. 22, 2015

(51) Int. Cl.
| | |
|---|---|
| *H01L 23/495* | (2006.01) |
| *H01L 23/00* | (2006.01) |
| *H01L 23/498* | (2006.01) |
| *H01L 21/48* | (2006.01) |
| *H01L 23/31* | (2006.01) |
| *H01L 21/56* | (2006.01) |

(52) U.S. Cl.
CPC ............ *H01L 24/81* (2013.01); *H01L 21/4825* (2013.01); *H01L 23/49517* (2013.01); *H01L 23/49548* (2013.01); *H01L 23/49582* (2013.01); *H01L 21/561* (2013.01); *H01L 23/3107* (2013.01); *H01L 24/13* (2013.01); *H01L 24/16* (2013.01); *H01L 2224/0401* (2013.01); *H01L 2224/05624* (2013.01); *H01L 2224/05639* (2013.01); *H01L 2224/05644* (2013.01); *H01L 2224/05647* (2013.01); *H01L 2224/13147* (2013.01); *H01L 2224/16245* (2013.01); *H01L 2224/8192* (2013.01); *H01L 2224/81191* (2013.01); *H01L 2224/81447* (2013.01); *H01L 2224/97* (2013.01)

(58) Field of Classification Search
CPC ............... H01L 23/4952; H01L 24/81; H01L 23/49811
USPC .......................................... 257/676; 438/123
See application file for complete search history.

(56) References Cited

U.S. PATENT DOCUMENTS

| | | | |
|---|---|---|---|
| 7,038,310 B1 * | 5/2006 | Nakatani et al. | 257/706 |
| 2011/0068427 A1 * | 3/2011 | Paek et al. | 257/433 |
| 2011/0133327 A1 | 6/2011 | Hsu | |
| 2012/0261689 A1 * | 10/2012 | Appelt et al. | 257/98 |
| 2013/0069226 A1 | 3/2013 | Lee | |
| 2013/0307144 A1 * | 11/2013 | Yu et al. | 257/737 |

FOREIGN PATENT DOCUMENTS

| | | |
|---|---|---|
| KR | 1020090011198 A | 2/2009 |
| KR | 20110123297 A | 11/2011 |
| KR | 20130030935 A | 3/2013 |

* cited by examiner

*Primary Examiner* — Walter H Swanson
(74) *Attorney, Agent, or Firm* — McAndrews, Held & Malloy, Ltd.

(57) ABSTRACT

A semiconductor device with plated pillars and leads is disclosed and may include a semiconductor die comprising a conductive pillar, a conductive lead electrically coupled to the conductive pillar, a metal plating layer covering the conductive lead and conductive pillar, and an encapsulant material encapsulating the semiconductor die and at least a portion of the plating layer. The pillar, lead, and plating layer may comprise copper, for example. The plating layer may fill a gap between the pillar and the lead. A portion of the metal plating layer may, for example, comprise an external lead. The metal plating layer may cover a side surface of the pillar and a top surface, side surface, and at least a portion of a bottom surface of the lead. The metal plating layer may cover side and bottom surfaces of the pillar and top, side, and at least a portion of bottom surfaces of the conductive lead.

17 Claims, 9 Drawing Sheets

SEMICONDUCTOR DEVICE WITH PLATED PILLARS AND LEADS

CROSS REFERENCE TO RELATED APPLICATIONS

The present application makes reference to, claims priority to, and claims the benefit of Korean Patent Application No. 10-2013-0083821, filed on Jul. 16, 2013, the contents of which are hereby incorporated herein by reference, in their entirety.

FIELD OF THE INVENTION

Certain embodiments of the invention relate to semiconductor chip packaging. More specifically, certain embodiments of the invention relate to a semiconductor device with plated pillars and leads.

BACKGROUND

In general, a semiconductor package includes a semiconductor die, a plurality of leads electrically connected to the semiconductor die and an encapsulant encapsulating the semiconductor die and the leads. A plurality of conductive pillars are provided on the semiconductor die to be electrically connected to the leads, and a solder is provided to electrically connect the conductive pillars to the leads.

When the solder is used in electrically connecting the conductive pillars to the leads, a high-temperature reflow process is generally performed and a width of the solder is further increased after the reflow process, reducing a distance between the conductive pillars, thereby increasing a probability of short circuits occurring between the pillars and packaging failures.

Further limitations and disadvantages of conventional and traditional approaches will become apparent to one of skill in the art, through comparison of such systems with the present invention as set forth in the remainder of the present application with reference to the drawings.

BRIEF SUMMARY

A semiconductor device with plated pillars and leads, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION

Figure 1A:
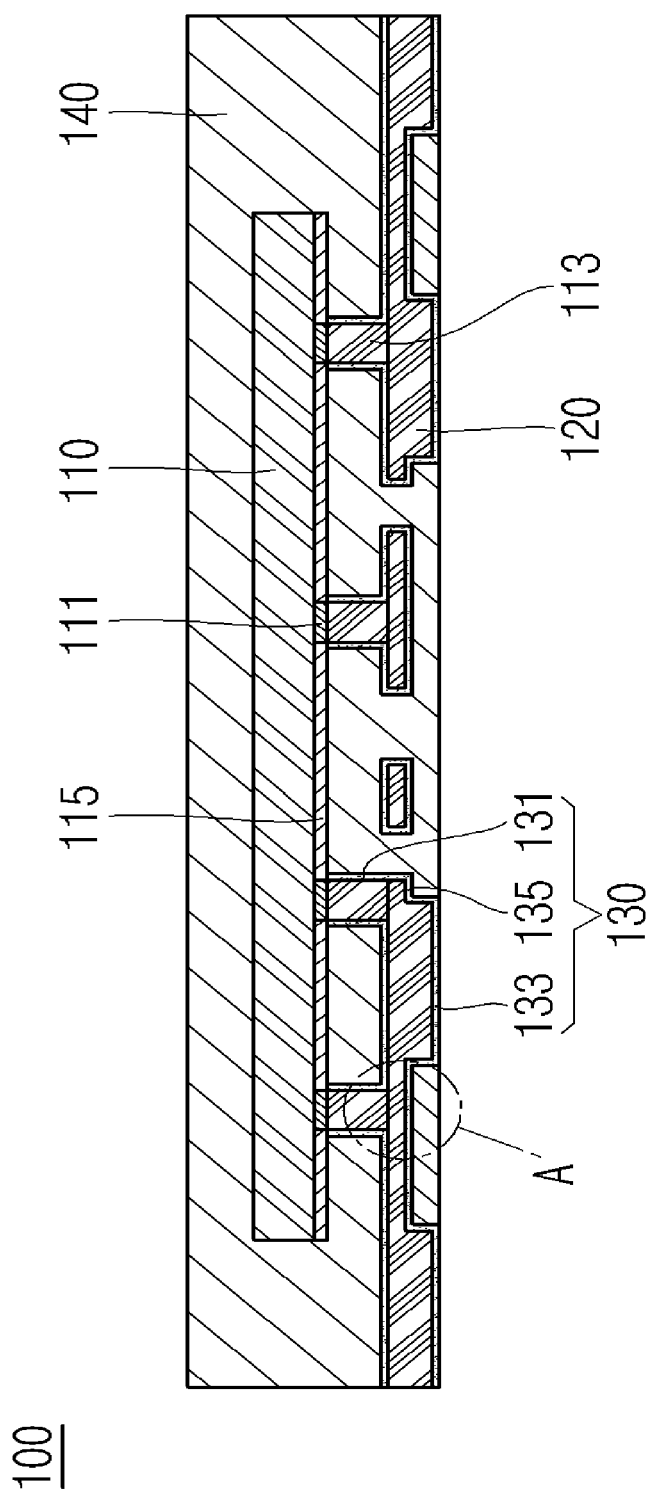
FIG. 1A is a cross-sectional view illustrating a semiconductor package according to an example embodiment of the present disclosure.

Certain aspects of the disclosure may be found in a semiconductor device with plated pillars and leads. Example aspects of the disclosure may comprise a semiconductor die comprising a conductive pillar, a conductive lead electrically coupled to the conductive pillar, a metal plating layer covering the conductive lead and conductive pillar, and an encapsulant material encapsulating the semiconductor die and at least a portion of the metal plating layer. The conductive pillar, the conductive lead, and the plating layer may comprise copper, for example. The metal plating layer may fill a gap between the conductive pillar and the conductive lead. A portion of the metal plating layer not encapsulated by the encapsulant material may comprise an external lead. The metal plating layer may cover a side surface of the conductive pillar and a top surface, side surface, and a portion of a bottom surface of the conductive lead. The metal plating layer may cover a side surface and a top surface of the conductive pillar and top surface, side surface, and a portion of a bottom surface of the conductive lead. The metal plated portion of the bottom surface of the conductive lead may be covered by encapsulant. The semiconductor die may comprise a metal pad to which the conductive pillar is bonded. The metal pad may comprise at least one material selected from: copper (Cu), aluminum (Al), gold (Au), and silver (Ag). The metal plating layer may comprise an electroplated metal layer.

The present invention may be embodied in many different forms and should not be construed as being limited to the example embodiments set forth herein. Rather, these example embodiments of the invention are provided so that this disclosure will be thorough and complete and will fully convey the concept of the invention to those skilled in the art, and the present invention will only be defined by the appended claims.

In the drawings, the thickness of layers and regions are exaggerated for clarity. Here, like reference numerals refer to like elements throughout. As used herein, the term "and/or" includes any and all combinations of one or more of the associated listed items.

In addition, the terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

The present disclosure describes a semiconductor package, which may minimize the manufacturing time with reduced costs and packaging failures, and a method for manufacturing the same.

In one example aspect, the present disclosure describes a semiconductor package comprising a semiconductor die including a plurality of conductive pillars, a plurality of leads electrically connected to the conductive pillars, a plated layer formed along surfaces of the conductive pillars and surfaces of the leads to connect the conductive pillars to the leads, and an encapsulant encapsulating the semiconductor die and a portion of the plated layer.

The plated layer may include a first plated layer formed on the surfaces of the conductive pillars, a second plated layer formed on the surfaces of the leads and outwardly exposed from the encapsulant, and a third plated layer formed on the surfaces of the leads and existing within the encapsulant. The first plated layer, the second plated layer and the third plated layer may be connected into a single body. The plated layer may further comprise a fourth plated layer formed between the bottom surfaces of the conductive pillars and top surfaces of the leads. The conductive pillars, the leads and the plated layer may include copper (Cu).

In another aspect, the present disclosure describes a method for manufacturing a semiconductor package, the method including aligning a plurality of semiconductor die (or dice) including a plurality of conductive pillars on a lead frame, forming a plated layer along surfaces of the conductive pillars and surfaces of the leads to connect the conductive pillars to the leads, and encapsulating the semiconductor die and a portion of the plated layer.

The method may further include sawing the encapsulant and the lead frame to produce individual semiconductor die (or packages comprising one or more individual semiconductor die). The lead frame may include a frame connecting the plurality of leads into a single body, the aligning of the semiconductor die may include aligning the semiconductor die to make the conductive pillars contact the leads, respectively. In the forming of the plated layer, a plurality of openings may be provided on the lead frame to allow some of metal ions to penetrate into the conductive pillars. The plated layer may be formed by electroplating. The conductive pillars, the leads and the plated layer may comprise copper (Cu), for example.

As described above, according to various aspects of the present disclosure, there is provided a semiconductor package, which may minimize the manufacturing time with reduced costs and packaging failures, and a method for manufacturing the same.

Figure 1B:
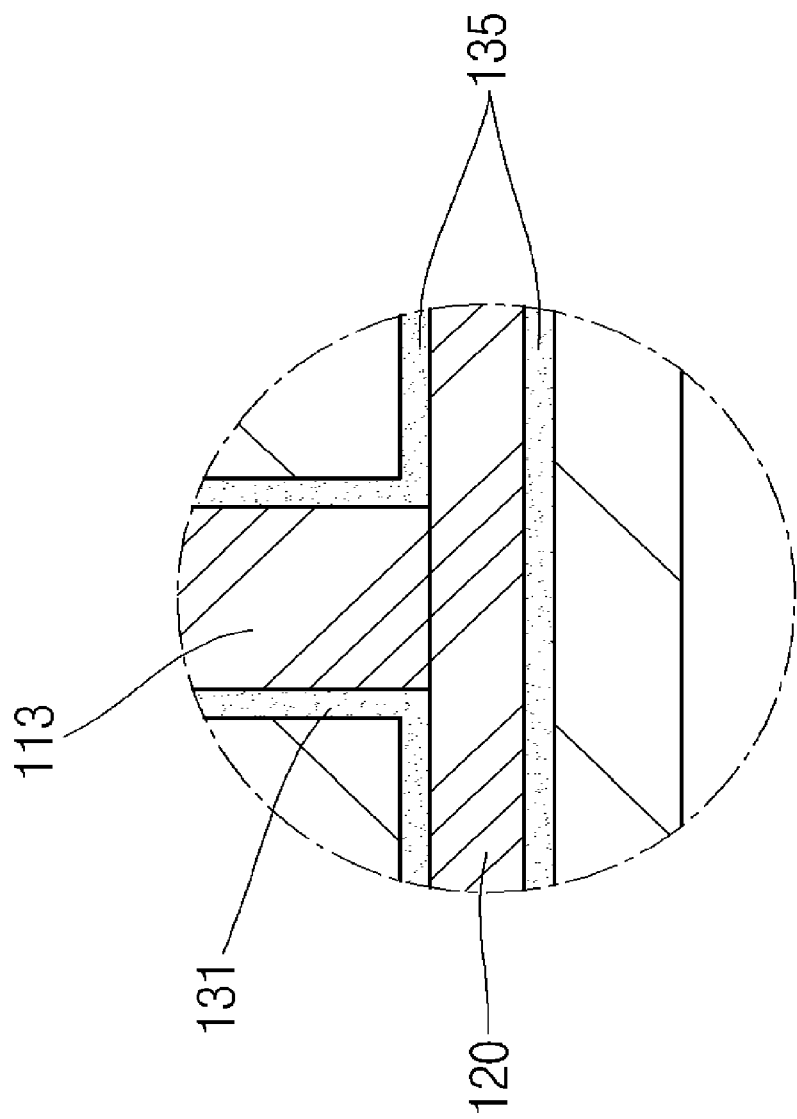
FIG. 1B is an enlarged view of a region 'A' shown in FIG. 1A, in accordance with an example embodiment of the present disclosure.
Figure 1C:
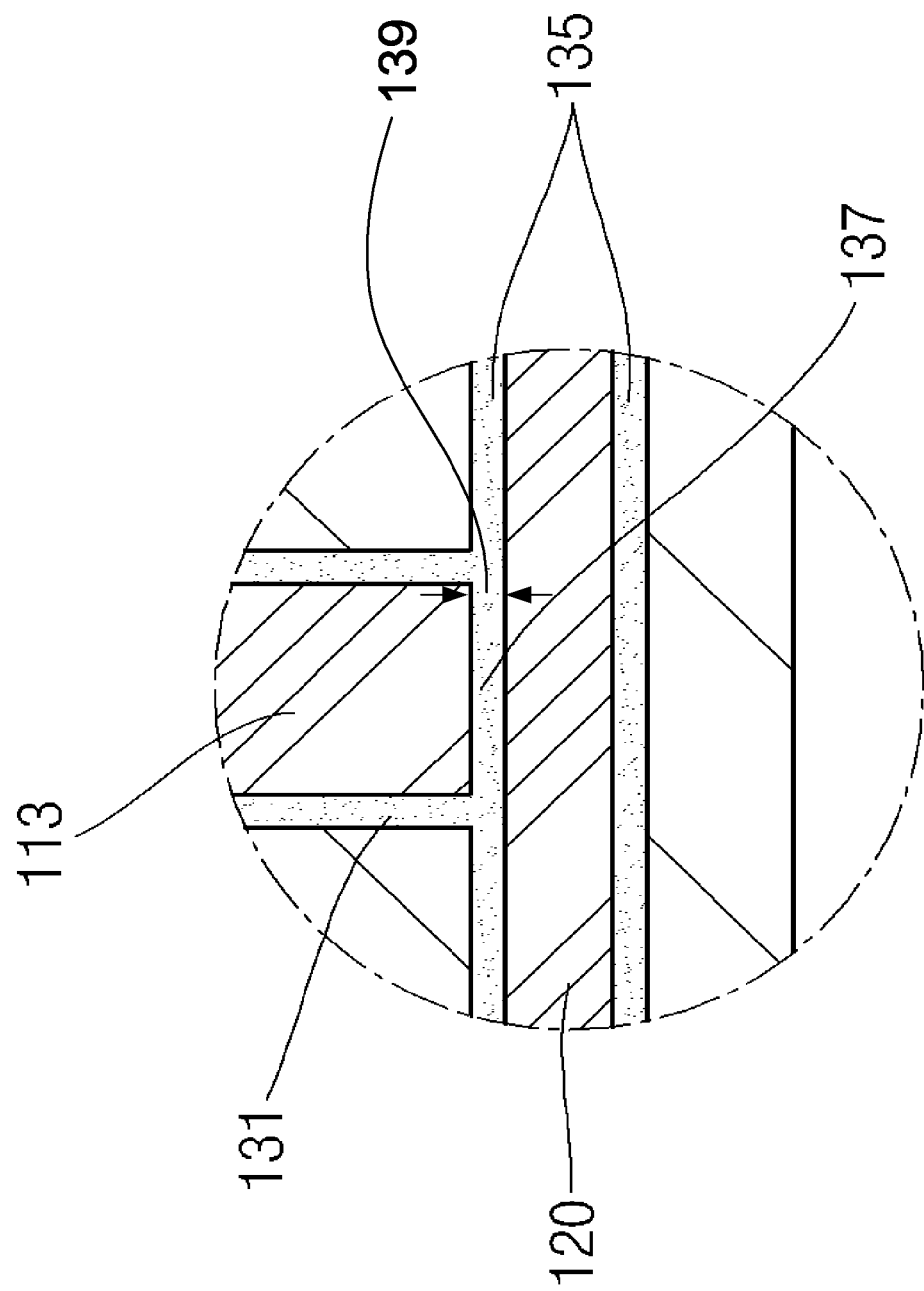
FIG. 1C illustrates another example of the region 'A' shown in FIG. 1A, in accordance with an example embodiment of the present disclosure.

FIG. 1A is a cross-sectional view illustrating a semiconductor package according to an example embodiment of the present disclosure, FIG. 1B is an enlarged view of a region 'A' shown in FIG. 1A, and FIG. 1C illustrates another example of the region 'A' shown in FIG. 1A.

Referring to FIG. 1A, the semiconductor package 100 according to the embodiment of the present disclosure includes a semiconductor die 110, a plurality of leads 120, a plating 130 and an encapsulant 140.

The semiconductor die 110 may comprise, for example, a plurality of metal pads 111 (e.g., bond pads), a plurality of conductive pillars 113 and a die protection layer 115.

The plurality of metal pads 111 may, for example, be formed on, for example, one surface of the semiconductor die 110 and may, for example, be electrically connected to, for example, a redistribution layer (not shown). The metal pads 111 may comprise, for example, at least one material selected from the group consisting of copper (Cu), aluminum (Al), gold (Au), silver (Ag) and equivalents thereof.

One end of the conductive pillars 113 may be bonded to the metal pads 111 and the other end of the conductive pillars 113 may be coupled to the leads 120. Accordingly, the conductive pillars 113 may electrically connect the semiconductor die 110 to the leads 120. The conductive pillars 113 may comprise, for example, copper (Cu).

The die protection layer 115 may be formed on a region of a surface of the semiconductor die 110, excluding a region where the metal pads 111 are formed, and may protect the semiconductor die 110. The die protection layer 115 may comprise oxide, nitride, or an organic layer.

The plurality of leads 120 may be, for example, substantially plate-shaped and separated from each other. The plurality of conductive pillars 113 may, for example, electrically contact top surfaces of the leads 120, respectively, and protrusions protruding from portions of the leads 120 may be formed on bottom surfaces of the leads 120. The protrusions outwardly protrude from the encapsulant 140 and may serve as connection terminals between the semiconductor package 100 and an external device. The leads 120 may comprise, for example, copper (Cu).

Meanwhile, the plurality of leads 120 may be configured to have different arrays or designs according to the design specification of the semiconductor package.

The plated layer 130 may, for example, be formed on, for example, surfaces of the conductive pillars 113 and surfaces of the leads 120 by electroplating. In more detail, the plated layer 130 may comprise a first plated layer 131, a second plated layer 133 and a third plated layer 135. The first plated layer 131 may be formed on surfaces of sidewalls of the conductive pillars 113. The second plated layer 133 may be formed on bottom surfaces of the protrusions on the bottom surfaces of the leads 120. The third plated layer 135 may be formed on surfaces of the leads 120, excluding contact regions between the conductive pillars 113 and the leads 120 and the second plated layer 133. Therefore, the second plated layer 133 may be exposed to the outside of the encapsulant 140, and the first and third plated layers 131 and 135 may be within the encapsulant 140. The first to third plated layers 131, 133 and 135 may be connected into a single integral body.

As described above, if the plated layer 130 comprises the first to third plated layers 131, 133 and 135, as shown in FIG. 1B, it may be planarized with the semiconductor die 110 and the leads 120, so that the bottom surfaces of the conductive pillars 113 make contact with the top surfaces of the leads 120.

Due to various manufacturing processes, warpage may occur to the semiconductor die 110 or the leads 120. In such instances, small gaps, such as the gap 139, may be produced between the conductive pillars 113 and the leads 120. However, even if there are gaps between the conductive pillars 113 and the leads 120, the gaps may be filled by the plated layer 130 formed on the top surfaces of the leads 120, thereby forming a fourth plated layer 137, as shown in FIG. 1C, and the fourth plated layer 137 connects the conductive pillars 113 to the leads 120. In such a manner, the fourth plated layer 137 electrically connects the conductive pillars 113 to the leads 120, thereby forming the first plated layer 131 on lateral surfaces of the conductive pillars 113 during the electroplating.

With this configuration, the plated layer 130 may connect the conductive pillars 113 and the leads 120 to each other. Accordingly, the semiconductor die 110 and the leads 120 may be interconnected by the plated layer 130. In addition to the aforementioned configuration of the plated layer 130, the plated layer 130 may also be configured to comprise at least regions ranging from surfaces of the sidewalls of the conductive pillars 113 to the top surfaces of the leads 120 to connect the conductive pillars 113 and the leads 120 to each other. The plated layer 130 may comprise, for example, copper (Cu).

The encapsulant 140 may be formed to encapsulate the semiconductor die 110 and portions of the leads 120 having the plated layer 130. Here, the second plated layer 133 formed on the leads 120 may be exposed to the outside of the encapsulant 140.

Meanwhile, the plated layer 130 might not be formed on the lateral surface of the lead 120 coplanar with the lateral surface of the encapsulant 140.

Next, a method for manufacturing a semiconductor device according to another embodiment of the present invention will be described with reference to the accompanying drawings.

Figure 2:
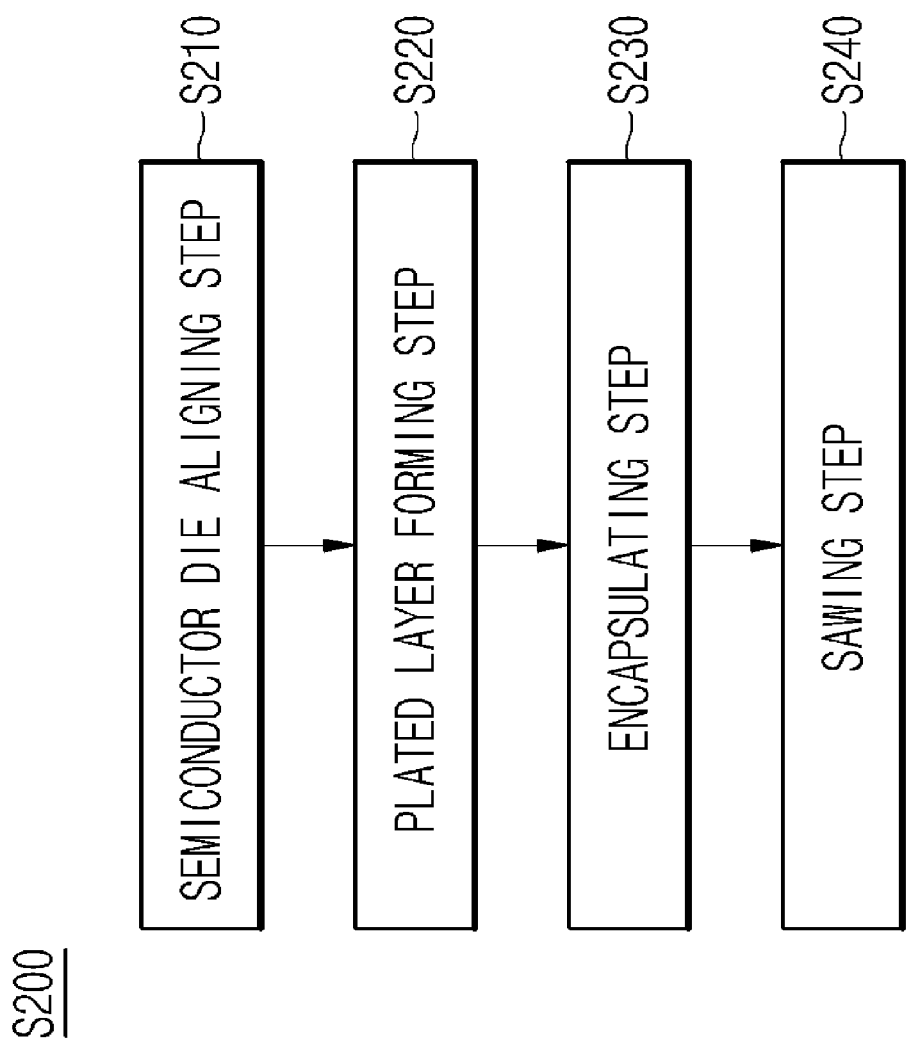
FIG. 2 is a flowchart illustrating an overall method for manufacturing a semiconductor device according to another example embodiment of the present disclosure.
Figure 3A:
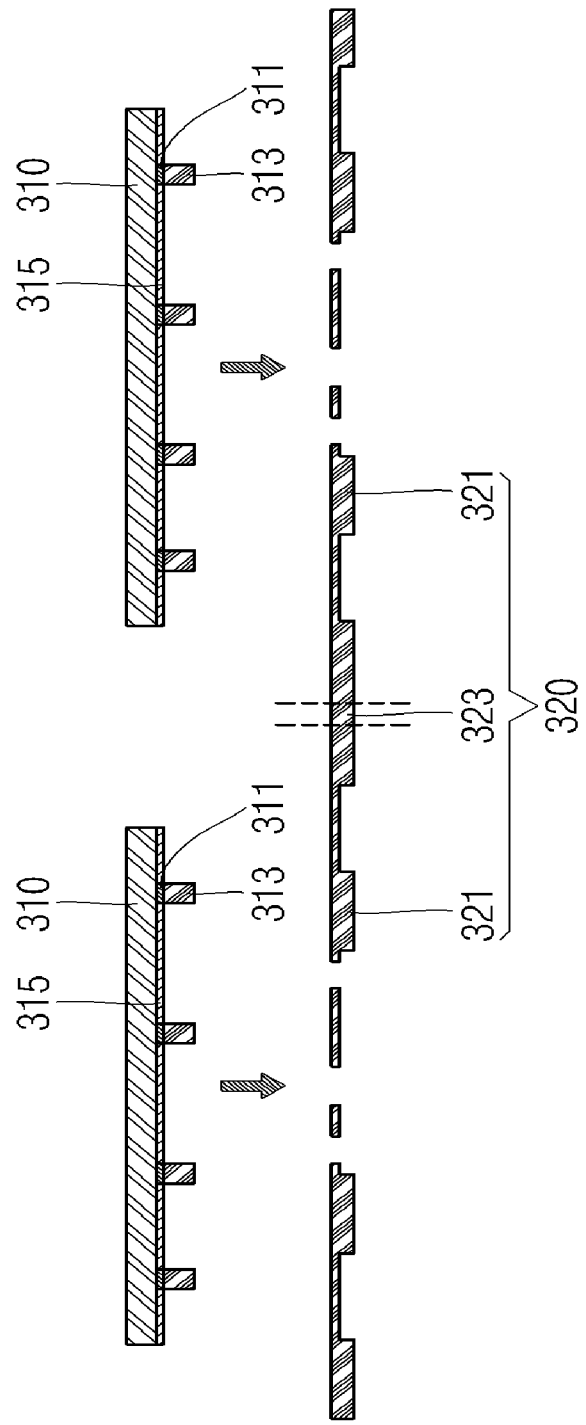
FIGS. 3A and 3B illustrate a semiconductor die alignment step in the method for manufacturing a semiconductor device according to another example embodiment of the present disclosure.
Figure 3B:
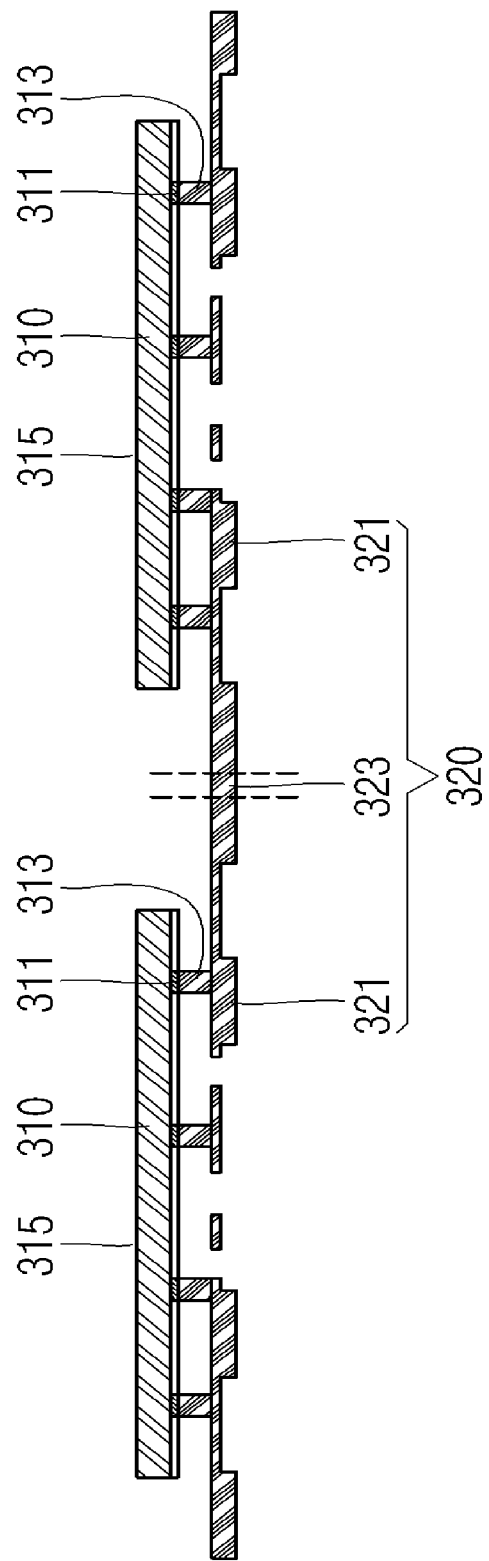
Figure 4:
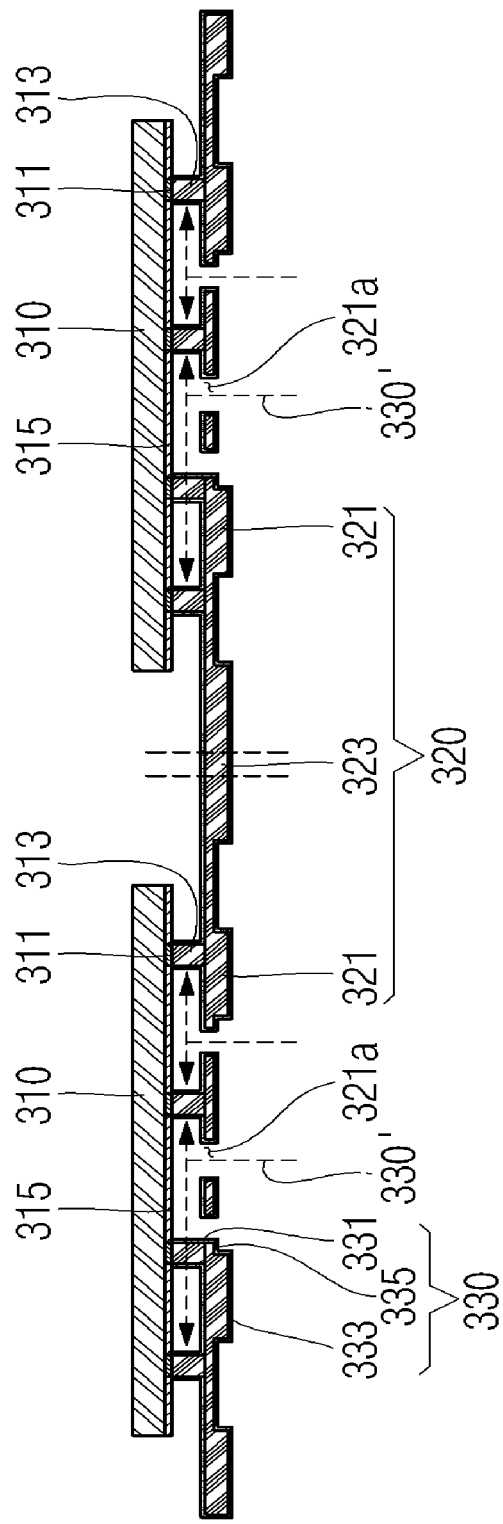
FIG. 4 illustrates a plating forming step in the method for manufacturing a semiconductor device according to another example embodiment of the present disclosure.
Figure 5:
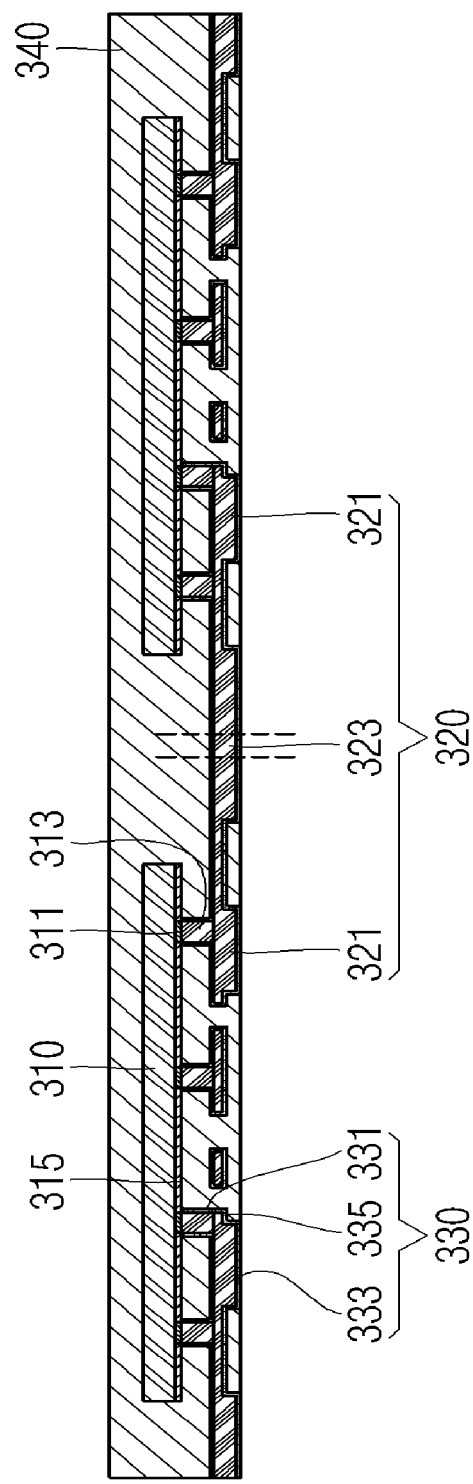
FIG. 5 illustrates an encapsulating step in the method for manufacturing a semiconductor device according to another example embodiment of the present disclosure.
Figure 6:
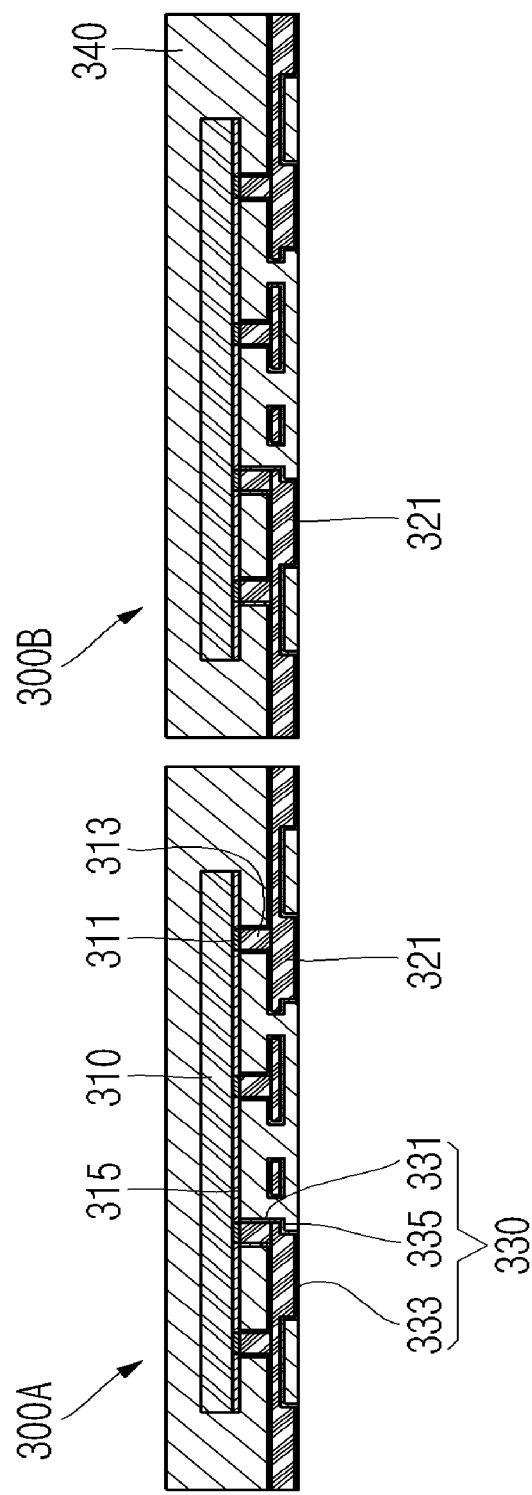
FIG. 6 illustrates a sawing step in the method for manufacturing a semiconductor device according to another example embodiment of the present disclosure.

FIG. 2 is a flowchart illustrating an overall method (S200) for manufacturing a semiconductor device according to another example embodiment of the present disclosure. FIGS. 3A and 3B illustrate a semiconductor die alignment step (S210) in the method (S200) for manufacturing a semiconductor device according to another example embodiment of the present disclosure. FIG. 4 illustrates a plated layer forming step (S220) in the method (S200) for manufacturing a semiconductor device according to another example embodiment of the present disclosure. FIG. 5 illustrates an encapsulating step (S230) in the method (S200) for manufacturing a semiconductor device according to another embodiment of the present disclosure. FIG. 6 illustrates a sawing step (S240) in the method (S200) for manufacturing a semiconductor device according to another example embodiment of the present disclosure.

Referring to FIGS. 2 to 6, the method (S200) for manufacturing a semiconductor device according to another example embodiment of the present disclosure comprises a semiconductor die aligning step (S210), a plated layer forming step (S220), an encapsulating step (S230) and a sawing step (S240).

In the semiconductor die aligning step (S210), as shown in FIGS. 3A and 3B, a plurality of semiconductor die 310 may be aligned on a lead frame 320.

Each of the semiconductor die 310 may comprise a plurality of metal pads 311 (e.g., bond pads), a plurality of conductive pillars 313 and a die protection layer 315.

The metal pads 311 may, for example, be formed on, for example, a surface of the semiconductor die 310 and may be electrically connected to a redistribution layer (not shown). The metal pads 311 may comprise, for example, at least one material selected from the group consisting of copper (Cu), aluminum (Al), gold (Au), silver (Ag) and equivalents thereof.

One end of the conductive pillars 313 may be bonded on the metal pads 311, respectively, and the other end of the conductive pillars 313 may electrically contact a top surface of the lead frame 320 through the aligning of the semiconductor die 310. The conductive pillars 313 may comprise, for example, copper (Cu). Note that the conductive pillars 313, the metal pads 311, and the leads 321 may be formed of a same metal.

The die protection layer 315 may be formed on a region of a surface of the semiconductor die 310, excluding a region where the metal pads 311 are formed, and may protect the semiconductor die 310. The die protection layer 315 may comprise a nitride-based material, for example.

The lead frame 320 may comprise substantially plate-shaped structures separated from each other and may comprise a plurality of leads 321 and a frame 323 connecting the leads 321 into a single body and fixing the same. Top surfaces of the leads 321 may make direct contact with the plurality of conductive pillars 313, respectively, and protrusions protruding from portions of the leads 321 may be formed on bottom surfaces of the leads 321. The protrusions outwardly protrude from the encapsulant 340 and may serve as connection terminals between the semiconductor package and an external device. The leads 321 and the frame 323 may comprise the same material, for example, copper (Cu).

In the plated layer forming step (S220), as shown in FIG. 4, the plated layer 330 may be formed on surfaces of the conductive pillars 313 and surfaces of the leads 321. Here, the plated layer 330 may be formed by electroplating, and may comprise a metal, such as copper (Cu) for example. Electroplating may be performed by dipping the semiconductor die 310 and the lead frame 320 in an electrolyte solution and connecting the lead frame 320 as a negative electrode and a copper plate as a positive electrode to a DC power device. The electrolyte solution may comprise copper (Cu) ions. Since the leads 321 may be separated from each other, a predetermined passageway 321a leading to the conductive pillars 313 may be provided between the leads 321. The passageway 321a may, for example, allow the Cu ions to easily penetrate into the conductive pillars 313 during electroplating, thereby shortening a plating time. As a result, oxidation/reduction reactions occur between each of the conductive pillars 313, the lead frame 320 and the Cu plate, thereby consequently forming the Cu plated layer 330 on the conductive pillars 313 and the lead frame 320.

The thus formed plated layer 330 may comprise a first plated layer 331, a second plated layer 333 and a third plated layer 335. Here, the first plated layer 331 may be defined as being formed on surfaces of sidewalls of the conductive pillars 313, the second plated layer 333 may be defined as being formed on bottom surfaces of the leads 321, specifically on bottom surfaces of the protrusions, and the third plated layer 335 be defined as being formed on the surface of the lead 321, excluding contact regions between the conductive pillars 313 and the leads 321 and the second plated layer 333.

The first to third plated layers 331, 333 and 335 are defined according to the formation regions and may be connected substantially into a single integral body. Accordingly, the conductive pillars 313 and the lead frame 320 may be connected to each other through the plated layer 330, thereby connecting the semiconductor die 310 and the lead frame 320 to each other.

Due to manufacturing processes, warpage may occur with the semiconductor die 310 or the lead frame 320. In such case, small gaps, as illustrated by the example gap 139 in FIG. 1C, may be produced between the conductive pillars 313 and the lead frame 320 when the semiconductor die 310 are aligned on the lead frame 320. However, even if there are gaps between the conductive pillars 313 and the lead frame 320, the gaps may be filled by the plated layer 330 formed on the top surface of the lead frame 320 during electroplating, thereby forming a plated layer between the bottom surfaces of the conductive pillars 313 and the lead frame 320. In such a manner, the plated layer electrically connects the conductive pillars 313 to the lead frame 320, thereby forming the first plated layer 331 on lateral surfaces of the conductive pillars 113 during the electroplating.

In the encapsulating step (S230), as shown in FIG. 5, the encapsulant 340 may be formed to cover the semiconductor die 310 and a portion of the plated layer 330. Here, the first and third plated layers 331 and 335 may exist within the encapsulant 340, and the second plated layer 333 may be exposed to the outside of the encapsulant 340. The second plated layer 333 exposed to the outside of the encapsulant 340 may serve as a connection terminal between the semiconductor package and an external device.

In the sawing step (S240), as shown in FIG. 6, individual semiconductor die, or packages comprising one or more of such die, may be produced by sawing a portion of the encapsulant 340 and the frame 323 (shown prior to sawing in FIG. 5). Here, the frame 323 and the portion of the encapsulant 340 on the frame 323 may be removed. Accordingly, the plurality of semiconductor die 300A and 300B may be provided.

In order to connect a semiconductor die to a lead, a solder was conventionally used. In such instances, a reflow process for welding (or wetting) the solder is typically needed, and a width of the solder may be increased after the reflow process, resulting in short circuits between conductive pillars.

According to various aspects of the present disclosure, however, conductive pillars and leads are directly connected to each other using a plated layer, thereby reducing the manufacturing time and costs. In addition, since the plated layer having a small thickness may be used, a probability of short circuits occurring between the conductive pillars may be reduced, thereby minimizing packaging failures, compared to the conventional case where solder is used.

In a conventional case where a semiconductor package is manufactured using an insulating substrate, it might be necessary to form bus bars for fixing leads on the insulating substrate. According to an example embodiment of the present disclosure, however, a lead frame may be used, the lead frame including a frame connecting a plurality of leads into a single body. Thus, it is not necessary to separately provide bus bars, unlike the conventional case.

This disclosure provides example embodiments supporting the present invention. The scope of the present invention is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure a semiconductor device with plated pillars and leads is disclosed and may comprise a semiconductor die comprising a conductive pillar, a conductive lead electrically coupled to the conductive pillar, a metal plating layer covering the conductive lead and conductive pillar, and an encapsulant material encapsulating the semiconductor die and at least a portion of the metal plating layer.

The conductive pillar, the conductive lead, and the plating layer may, for example, comprise copper. Also for example, the conductive pillar, the conductive lead, and the plating layer may be formed of a same metal. The metal plating layer may, for example, fill a gap between the conductive pillar and the conductive lead. A portion of the metal plating layer not encapsulated by the encapsulant material may comprise an external lead. The metal plating layer may cover a side surface of the conductive pillar and a top surface, side surface, and at least a portion of a bottom surface of the conductive lead.

The metal plating layer may cover a side surface and a top surface of the conductive pillar and top surface, side surface, and at least a portion of a bottom surface of the conductive lead. The metal plated portion of the bottom surface of the conductive lead may be covered by encapsulant. The semiconductor die may comprise a metal pad to which the conductive pillar is bonded. The metal pad may, for example, comprise at least one material selected from: copper (Cu), aluminum (Al), gold (Au), and silver (Ag). The metal plating layer may comprise an electroplated metal layer.

While the invention has been described with reference to certain supporting embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device comprising:
a semiconductor die comprising a conductive pillar;
a conductive lead electrically coupled to the conductive pillar;
a metal plating layer extending from the semiconductor die and covering the conductive lead and the conductive pillar; and
an encapsulant material encapsulating the semiconductor die and at least a portion of the metal plating layer;
wherein the metal plating layer covers a side surface of the conductive pillar and a top surface, a side surface, and at least a portion of a bottom surface of the conductive lead.

2. The semiconductor device according to claim 1, wherein the conductive pillar, the conductive lead, and the plating layer comprise copper.

3. The semiconductor device according to claim 1, wherein the metal plating layer fills a gap between the conductive pillar and the conductive lead.

4. The semiconductor device according to claim 1, wherein the metal plating layer covers a side surface and a bottom surface of the conductive pillar and at least the portion of the bottom surface of the conductive lead.

5. The semiconductor device according to claim 4, wherein the metal plating layer covering at least the portion of the bottom surface of the conductive lead is covered by the encapsulant material.

6. The semiconductor device according to claim 1, wherein the semiconductor die comprises a metal pad to which the conductive pillar is bonded.

7. The semiconductor device according to claim 6, wherein the metal pad comprises at least one material selected from: copper (Cu), aluminum (Al), gold (Au), and silver (Ag).

8. The semiconductor device according to claim 1, wherein the metal plating layer comprises an electroplated metal layer.

9. A semiconductor device comprising:
a semiconductor die comprising a conductive pillar;
a conductive lead electrically coupled to the conductive pillar;
a metal plating layer extending from the semiconductor die and covering the conductive lead and the conductive pillar; and
an encapsulant material encapsulating the semiconductor die and at least a portion of the metal plating layer;
wherein a portion of the metal plating layer not encapsulated by the encapsulant material comprises an external lead portion of the conductive lead of the semiconductor device.

10. A semiconductor device comprising:
a semiconductor die comprising a conductive pillar and a die protection layer on the semiconductor die adjacent to the conductive pillar;
a conductive lead electrically coupled to the conductive pillar;
a metal plating layer covering the conductive lead and the conductive pillar; and
an encapsulant material encapsulating the semiconductor die, the die protection layer, and at least a portion of the metal plating layer;
wherein:
a portion of the conductive lead not covered by the metal plating layer comprises an external lead portion of the conductive lead of the semiconductor device; and
a portion of the metal plating layer not encapsulated by the encapsulant material comprises a portion of the external lead portion.

11. The semiconductor device according to claim 10, wherein the conductive pillar, the conductive lead, and the plating layer comprise copper.

12. The semiconductor device according to claim 10, wherein the metal plating layer fills a gap between the conductive pillar and the conductive lead.

13. The semiconductor device according to claim 10, wherein the semiconductor die comprises a metal pad to which the conductive pillar is bonded.

14. The semiconductor device according to claim 13, wherein the metal pad comprises at least one material selected from: copper (Cu), aluminum (Al), gold (Au), and silver (Ag).

15. A semiconductor device comprising:
a semiconductor die comprising a conductive pillar and a die protection layer on the semiconductor die adjacent to the conductive pillar;
a conductive lead electrically coupled to the conductive pillar;
a metal plating layer covering the conductive lead and the conductive pillar; and
an encapsulant material encapsulating the semiconductor die, the die protection layer, and at least a portion of the metal plating layer;
wherein:
a portion of the conductive lead not covered by the metal plating layer comprises an external lead portion of the conductive lead of the semiconductor device; and
the metal plating layer covers a side surface of the conductive pillar and a top surface, a side surface, and at least a portion of a bottom surface of the conductive lead.

16. A semiconductor device comprising:
a semiconductor die comprising a conductive pillar and a die protection layer on the semiconductor die adjacent to the conductive pillar;
a conductive lead electrically coupled to the conductive pillar;
a metal plating layer covering the conductive lead and the conductive pillar; and
an encapsulant material encapsulating the semiconductor die, the die protection layer, and at least a portion of the metal plating layer;
wherein:
a portion of the conductive lead not covered by the metal plating layer comprises an external lead portion of the conductive lead of the semiconductor device; and
the metal plating layer covers a side surface and a bottom surface of the conductive pillar and a top surface, a side surface, and at least a portion of a bottom surface of the conductive lead.

17. The semiconductor device according to claim 16, wherein the metal plating layer covering at least the portion of the bottom surface of the conductive lead is covered by encapsulant.

* * * * *